United States Patent
Lung et al.

(10) Patent No.: US 8,008,114 B2
(45) Date of Patent: Aug. 30, 2011

(54) PHASE CHANGE MEMORY DEVICE AND MANUFACTURING METHOD

(75) Inventors: Hsiang-Lan Lung, Dobbs Ferry, NY (US); Shih-Hung Chen, Hsinchu, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/843,806

(22) Filed: Jul. 26, 2010

(65) Prior Publication Data

US 2010/0291747 A1 Nov. 18, 2010

Related U.S. Application Data

(60) Division of application No. 11/621,390, filed on Jan. 9, 2007, now Pat. No. 7,786,460, and a continuation-in-part of application No. 11/459,106, filed on Jul. 21, 2006, now Pat. No. 7,450,411.

(60) Provisional application No. 60/758,784, filed on Jan. 13, 2006, provisional application No. 60/736,722, filed on Nov. 15, 2005.

(51) Int. Cl.
*H01L 21/00* (2006.01)
*H01L 47/00* (2006.01)

(52) U.S. Cl. ........ 438/95; 438/92; 438/96; 438/97; 438/466; 257/2; 257/3; 257/4; 257/5; 257/E27.004; 257/E31.092; 257/E45.002

(58) Field of Classification Search ............ 438/92, 438/95, 96, 97, 466; 257/2, 3, 4, 5, E27.004, 257/E31.092, E45.002

See application file for complete search history.

(56) References Cited

U.S. PATENT DOCUMENTS

| 3,271,591 A | 9/1966 | Ovshinsky |
| 3,530,441 A | 9/1970 | Ovshinsky |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii |

(Continued)

FOREIGN PATENT DOCUMENTS

WO 0045108 A1 8/2000

(Continued)

OTHER PUBLICATIONS

Yamada, Noboru, "Potential of Ge-Sb-Te phase-change optical disks for high-data-rate recording in the near future," (Conference Proceedings Paper), Jul. 30, 1997, vol. 3109, 10 pages.

(Continued)

*Primary Examiner* — Dao H Nguyen
(74) *Attorney, Agent, or Firm* — James F. Hann; Haynes Beffel & Wolfeld LLP

(57) ABSTRACT

A phase change memory device comprises a photolithographically formed phase change memory cell having first and second electrodes and a phase change element positioned between and electrically coupling the opposed contact elements of the electrodes to one another. The phase change element has a width, a length and a thickness. The length, the thickness and the width are less than a minimum photolithographic feature size of the process used to form the phase change memory cell. The size of the photoresist masks used in forming the memory cell may be reduced so that the length and the width of the phase change element are each less than the minimum photolithographic feature size.

12 Claims, 21 Drawing Sheets

U.S. PATENT DOCUMENTS

| | | |
|---|---|---|
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi |
| 5,391,901 A | 2/1995 | Tanabe |
| 5,515,488 A | 5/1996 | Hoppe et al. |
| 5,534,712 A | 7/1996 | Ovshinsky et al. |
| 5,550,396 A | 8/1996 | Tsutsumi |
| 5,687,112 A | 11/1997 | Ovshinsky |
| 5,688,713 A | 11/1997 | Linliu et al. |
| 5,716,883 A | 2/1998 | Tseng |
| 5,754,472 A | 5/1998 | Sim |
| 5,789,277 A * | 8/1998 | Zahorik et al. ............... 438/95 |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 * | 5/2001 | Wolstenholme et al. ......... 257/3 |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,620,715 B1 | 9/2003 | Blosse et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,808,991 B1 | 10/2004 | Tung |
| 6,815,704 B1 | 11/2004 | Chen |
| 6,830,952 B2 | 12/2004 | Lung |
| 6,838,692 B1 | 1/2005 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg |
| 6,992,932 B2 | 1/2006 | Cohen |
| 7,018,911 B2 * | 3/2006 | Lee et al. ..................... 438/466 |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kang |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |

| | | |
|---|---|---|
| 7,122,824 B2 | 10/2006 | Khouri et al. |
| 7,126,149 B2 | 10/2006 | Iwasaki et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung |
| 7,208,751 B2 | 4/2007 | Ooishi |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,269,052 B2 | 9/2007 | Segal et al. |
| 7,277,317 B2 | 10/2007 | Le Phan |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung |
| 7,365,385 B2 | 4/2008 | Abbott |
| 7,379,328 B2 | 5/2008 | Osada et al. |
| 7,385,235 B2 | 6/2008 | Lung |
| 7,394,088 B2 | 7/2008 | Lung |
| 7,397,060 B2 | 7/2008 | Lung |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,507,986 B2 | 3/2009 | Lung |
| 7,514,334 B2 | 4/2009 | Chen et al. |
| 7,515,461 B2 | 4/2009 | Happ et al. |
| 7,572,666 B2 * | 8/2009 | Dennison et al. ............... 438/95 |
| 7,786,460 B2 | 8/2010 | Lung et al. |
| 2001/0055838 A1 | 12/2001 | Walker et al. |
| 2002/0070457 A1 | 6/2002 | Sun et al. |
| 2002/0081833 A1 | 6/2002 | Li et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2003/0203555 A1 | 10/2003 | Dennison et al. |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0030832 A1 | 2/2005 | Lee et al. |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0038221 A1 | 2/2006 | Lee et al. |
| 2006/0043617 A1 | 3/2006 | Abbott |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0163554 A1 | 7/2006 | Lankhorst et al. |
| 2006/0172067 A1 | 8/2006 | Ovshinsky et al. |
| 2006/0175599 A1 | 8/2006 | Happ |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289848 A1 | 12/2006 | Dennison |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0096162 A1 | 5/2007 | Happ et al. |
| 2007/0096248 A1 | 5/2007 | Philipp et al. |
| 2007/0097739 A1 * | 5/2007 | Happ et al. ..................... 365/163 |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |

| | | |
|---|---|---|
| 2007/0246699 A1 | 10/2007 | Lung |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0164453 A1 | 7/2008 | Lung et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Lung et al. |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2010/0001248 A1 | 1/2010 | Wouters et al. |

FOREIGN PATENT DOCUMENTS

| | | |
|---|---|---|
| WO | 79539 A1 | 12/2000 |
| WO | 145108 A1 | 6/2001 |
| WO | 0225733 A2 | 3/2002 |

OTHER PUBLICATIONS

Ahn, S. J. et al., "Highly Reliable 5nm Contact Cell Technology for 256Mb PRAM," VLSI Technology, Digest of Technical Papers, Jun. 14-16, 2005, pp. 98-99.

Adler, David, "Amorphous-Semiconductor Devices," Sci. Amer., vol. 236, pp. 36-48, May 1977.

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, AN et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3.sup.rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24.mu.m-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43.sup.rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org, Dec. 18 & 25, 2004, p. 389, vol. 166.

Mott, Nevi, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel .mu.Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org, Mar. 19, 2005, p. 189, vol. 167.

Rochefort, C. et al., "Manufacturing of High Aspect-Ration p-n. Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21.sub.—Tyson.sub.—P.PD—F#search='nonvolatile%20high%20density%20high%20performance%20phase%20chan-ge%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. J H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

"Optimized Thermal Capacitance in a Phase Change Memory Cell Design," IPCOM000141986D, IP.com Prior Art Database, Oct. 18, 2006, 4pp.

"Thermal Conductivity of Crystalline Dielectrics" in CRC Handbook of Chemistry and Physics, Internet Version 2007, (87th edition), David R. Lide, ed. Taylor and Francis, Boca Raton, FI, 2pp.

Atwood, G, et al., "90 nm Phase Change Technology with u Trench and Lance Cell Elements," VLSI Technology, Systems and Applications, Apr. 23-25, 2007, pp. 1-2.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Gleixner, "Phase Change Memory Reliability", 22nd NVSMW, Aug. 26, 2007, 46 pages.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

* cited by examiner

PHASE CHANGE MEMORY DEVICE AND MANUFACTURING METHOD

CROSS REFERENCE TO RELATED APPLICATIONS

This application is a divisional of U.S. patent application Ser. No. 11/621,390; filed 9 Jan. 2007, titled Phase Change Memory Device and Manufacturing Method, which application claims the benefit of U.S. provisional patent application No. 60/758,784, filed 13 Jan. 2006, titled Phase Change Memory Device and Manufacturing Method. This application is a continuation-in-part of U.S. patent application Ser. No. 11/459,106, filed 21 Jul. 2006, which application claims the benefit of provisional patent application No. 60/736,722 filed 15 Nov. 2005, titled Phase Change Memory Device and Manufacturing Method.

BACKGROUND OF THE INVENTION

1. Field of the Invention

The present invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or break down the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. It is desirable therefore to provide a memory cell structure having small dimensions and low reset currents, and a method for manufacturing such structure.

SUMMARY OF THE INVENTION

A first aspect of the invention is directed to a phase change memory device comprising a memory cell access layer and a memory cell layer, operably coupled to the memory cell access layer, comprising a lithographically formed phase change memory cell. The memory cell comprises first and second electrodes, having first and second opposed, spaced apart contact elements, and a phase change element positioned between the first and second contact elements and electrically coupling the first and second contact elements to one another. The phase change element has a width, a length and a thickness, the length measured between the first and second contact elements and the width measured perpendicular to the length. The length, the thickness and the width are less than a minimum photolithographic feature size of the process used to form the phase change memory cell. In some embodiments the minimum lithographic feature size is about 200 nm, the length is about 10 to 100 nm, the width is about 10 to 50 nm, and the thickness is about 10 to 50 nm.

A second aspect of the invention is directed to a method for making a phase change memory device. A memory cell access layer is formed on a substrate, the memory cell access layer comprising an access device and a top surface. A memory cell layer is formed and is operably coupled to the memory cell access layer, the memory cell layer comprising a lithographically formed phase change memory cell. The memory cell comprises first and second electrodes, having first and second opposed, spaced apart contact elements, and a phase change element positioned between the first and second contact elements and electrically coupling the first and second contact elements to one another. The phase change element has a width, a length and a thickness. The memory layer forming step comprises reducing the size of photoresist masks used in the memory layer forming step so that the length and the width of the phase change element are each less than a minimum lithographic feature size of the process used to form the phase change memory cell.

The method described herein for formation of the phase change element, for use in a memory cell in a phase change read only memory (PCRAM) device, can be used to make small phase change gates, bridges or similar structures for other devices.

Various features and advantages of the invention will appear from the following description in which the preferred embodiments have been set forth in detail in conjunction with the accompanying drawings.

BRIEF DESCRIPTION OF THE DRAWINGS

FIGS. 3 and 4 illustrate the final stages for making the memory cell access layer of FIG. 2;

FIG. 5 illustrates the deposition of a phase change material layer and a first barrier layer on top of the memory cell access layer of FIG. 4;

FIGS. 6 and 7 are side and top views showing a first photoresist mask on the first barrier layer;

FIGS. 8 and 9 illustrate the result of trimming the mask of FIGS. 6 and 7;

FIGS. 10 and 11 show the result of etching the first barrier layer of FIG. 8 followed by the removal of the mask of FIG. 8;

FIG. 12 shows the structure of FIG. 10 following etching of the phase change material layer;

FIG. 13 is a cross-sectional view taken a long line 13-13 of FIG. 12;

FIGS. 14 and 15 illustrates a result of several processing steps to create three open regions defined by a second photoresist mask;

FIG. 16 illustrates the result of an oxide etching step through the open regions;

FIG. 17 illustrates the structure of FIG. 16 following removal of the mask;

FIGS. 18 and 19 show the result of a sidewall trimming step;

FIG. 20 shows the result of etching through the phase change element structure of FIG. 18;

FIG. 21 shows the structure of FIG. 20 after deposition of an electrical contact enhancement layer followed by deposition of an electrical conductor;

FIGS. 22 and 22A show the structure of FIG. 1 after a chemical mechanical polishing step;

FIG. 23 illustrates a second separation layer applied onto the structure of FIG. 22;

FIGS. 24 and 25 are side and top views showing a plug passing through a via within the second separation layer;

FIG. 27 shows a mask deposited on the structure of FIG. 26;

FIG. 28 shows the mask of FIG. 27 trimmed;

FIG. 29 is similar to FIG. 10 and shows a result of etching followed by the removal of the mask of FIG. 28;

FIG. 30 shows the result of another etching step followed by the removal of the etched barrier layer of FIG. 29;

FIG. 31 shows the deposition of a barrier layer over the structure of FIG. 30;

FIG. 32 shows the formation of a mask on the structure of FIG. 31;

FIG. 33 shows the result of etching followed by the removal of the mask of FIG. 32;

FIG. 34 shows result of stacked etching the material below the open regions of FIG. 33 down to the top surface of the memory cell access layer;

FIG. 35 illustrates result of the deposition of an electrical contact enhancement layer onto the structure of FIG. 34;

FIG. 36 shows the structure of FIG. 35 after a chemical mechanical polishing step;

FIG. 37 shows the deposition of a separation layer onto the structure of FIG. 36; and FIG. 38 shows the result of creating a via down to the electrical contact enhancement layer, filling the via with an electrically conductive material, and covering the structure with a metal layer to create an alternative embodiment of the phase change memory device of FIGS. 1 and 2.

DETAILED DESCRIPTION

Figure 1:
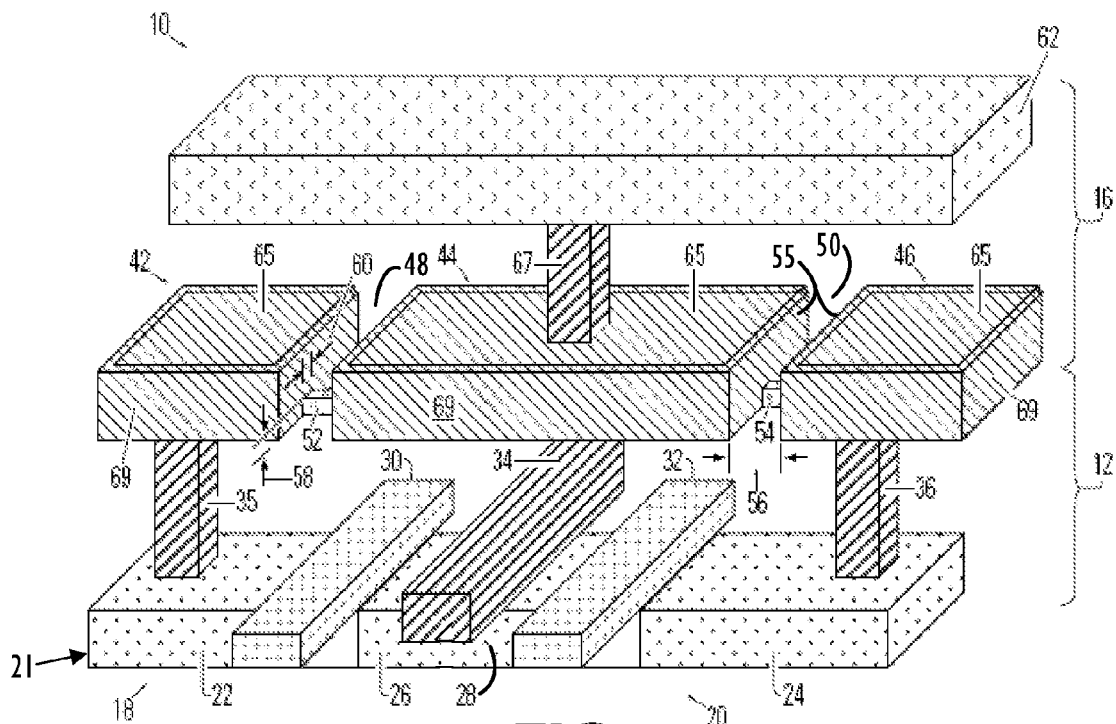
FIGS. 1 and 2 are a simplified isometric view and a simplified cross-sectional view of the components of a phase change memory device made according to the invention.

The following description of the invention will typically be with reference to specific structural embodiments and methods. It is to be understood that there is no intention to limit the invention to the specifically disclosed embodiments but that the invention may be practiced using other features, elements, methods and embodiments. Like elements in various embodiments are commonly referred to with like reference numerals.

Figure 2:
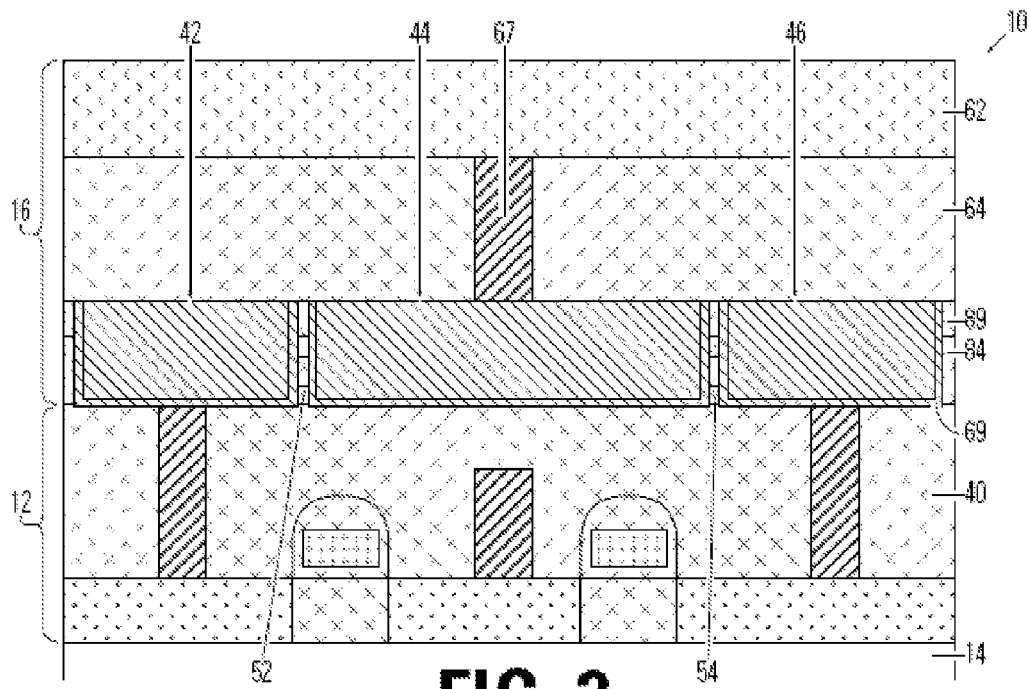

FIGS. 1 and 2 are two views of a phase change memory device 10 made according to one embodiment of the invention. Device 10 comprises broadly a memory cell access layer 12 formed on a substrate 14 and a memory cell layer 16 formed on top of access layer 12. In this embodiment, access layer 12 comprises first and second access transistors 18, 20 formed at doped layer 21. Access transistors 18, 20 comprise first and second drains 22, 24, first and second sources 26, 28, first and second polysilicon word lines acting as first and second gates 30, 32, and a common source line 34. Common source line 34 contacts first and second sources 26, 28. If desired, a separate source line for each of first and second sources 26, 28 could be provided. Access transistors 18, 20 are generally conventional but need not be so. Also, access layer 12 could include access devices other than access transistors. First and second plugs 35, 36 extend from the top surface 38 of memory cell access layer 12, through a dielectric film layer 40 and to doped layer 21.

Memory cell layer 16 comprises a first electrode 42 contacting top surface 38 and first plug 35, a second electrode 44 contacting top surface 38, and a third electrode 46 contacting top surface 38 and second plug 36. First and second electrodes 42, 44 are separated by a gap 48 while second and third electrodes 44, 46 are separated by a gap 50. First and second phase change elements 52, 54 are formed within first and second gaps 48, 50 between and in contact with top surface 38 and in contact with the side walls 55 defining electrodes 42, 44, 46. As shown in FIG. 2, first and second phase change elements 52, 54 have a length 56 and a thickness 58. As shown in FIG. 1, each of first and second phase change elements 52, 54 have a width 60. Length 56, thickness 58 and width 60 are typically the same for both phase change elements, but need not be so. As discussed in more detail below, the size of phase change elements 52, 54 is minimized to reduce the current needed to cause a change between a lower resistivity, generally crystalline state and a higher resistivity, generally amorphous state.

Memory cell layer 16 also includes a conductive bit line 62 separated from electrode 42, 44 and 46 by a separation layer 64, typically made of a dielectric material such as silicon dioxide. An electrically conductive plug 67 extends through a via 66 formed through second separation layer 64 to electrically connect bit line 62 and second electrode 44.

Memory device 10 is substantially similar to the memory device showing FIGS. 1 and 2 of U.S. provisional patent application No. 60/736,722 with the following exception. Electrodes 42, 44, 46 of the present invention each comprise a main body portion 65 surround by an electrical contact enhancement material 69. Material 69 acts as a contact element for contact with phase change elements 54, 56 to enhance the electrical contact between electrode 42, 44 and 46 and the phase change elements. Main body portion 65 is typically tungsten while electrical contact enhancement material 69 is typically TiN, although other electrical contact enhancement materials such as TaAlN, WAlN or TiAlN may also be used.

Figure 3:
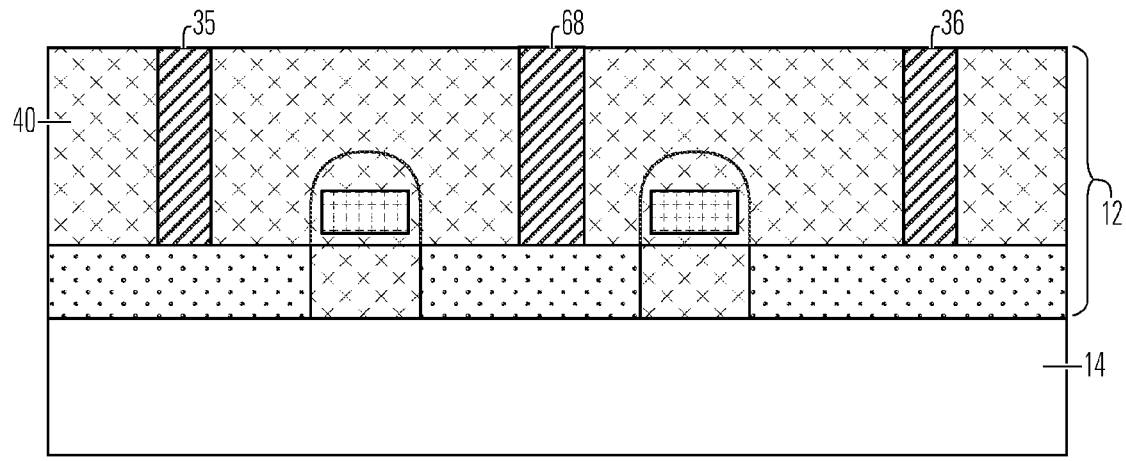
FIGS. 3-25 illustrate a method for making phase change memory devices, such as the device of FIGS. 1 and 2.
Figure 4:
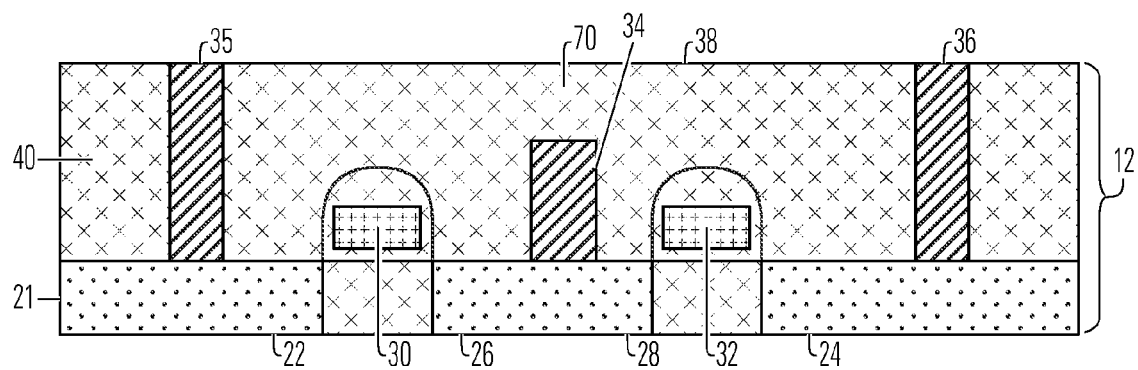

A method for making phase change memory devices will now be discussed with reference to FIG. 3-25. Memory cell access layer 12 is typically made by conventional techniques. FIGS. 3 and 4 illustrate the final stages of making memory cell access layer 12. A source plug 68 is formed from top surface 38 to doped layer 21 between first and second gates 30, 32. A portion of source plug 68 adjacent to top surface 38 is removed, typically by etching, and the etched region is filled in with a dielectric material 70. Thereafter top surface 38 is subjected to chemical mechanical polishing to make the top surface suitable for deposition of memory cell layer 16.

Figure 4A:
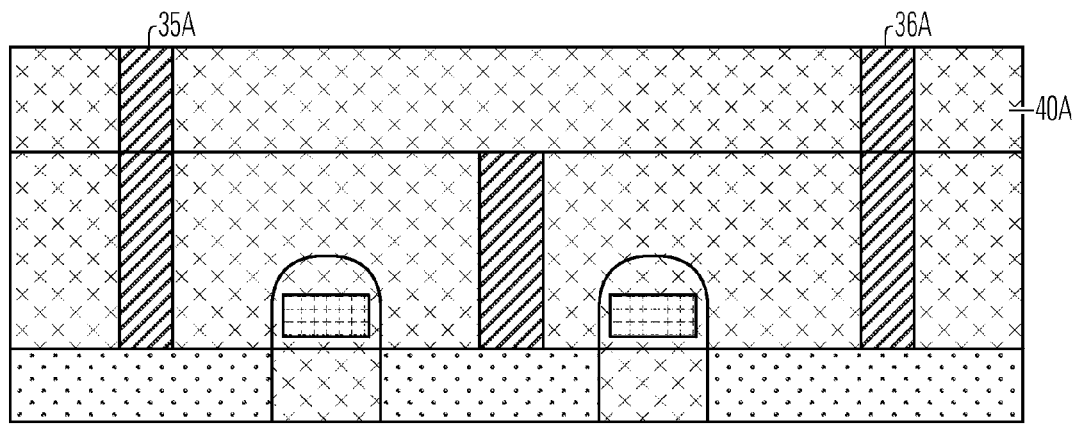
FIG. 4A illustrates an alternative embodiment of the memory cell access layer of FIG. 4.
Figure 5:
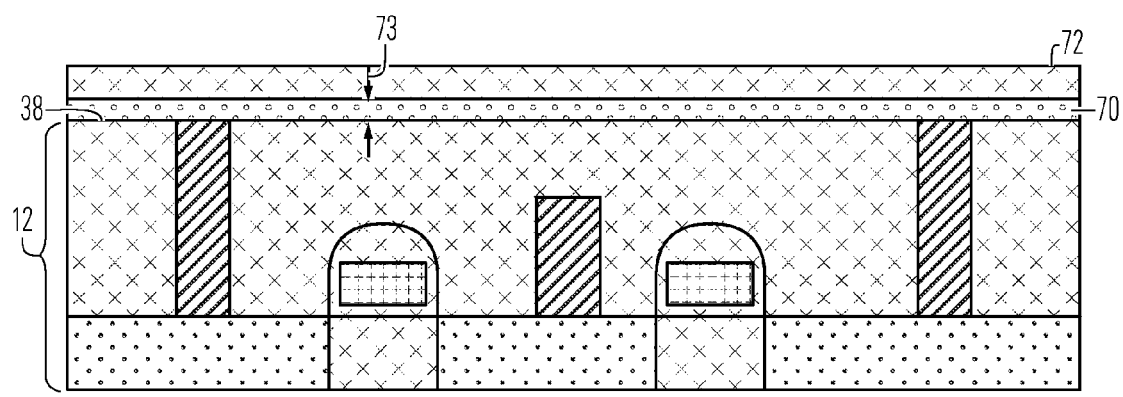

FIG. 4A illustrates an alternative embodiment of memory cell access layer 12 which replaces etching a portion of source plug 68 and substitutes depositing another dielectric filler layer 40A and then forming extensions 35A, 36A of plugs 35, 36 through the dialectic filler layer 40A. FIG. 5 shows the memory cell access layer 12 of FIG. 4 after deposition of a phase change material layer 70 on top surface 38 and deposition of a first barrier layer 72, also called a cap layer, layer 72 typically an SiN oxygen barrier layer. Phase change material layer 70 has a thickness 73 corresponding to thickness 58 of FIG. 1. Layer 70 is preferably as thin as it can be made while maintaining appropriate functional characteristics for phase change bridges 52, 54. In this embodiment both layers 70, 72 are about 20 nm thick. Thickness 73 is preferably about 10 to 50 nm and more preferably no more than about 20 nm thick when made of, for example, conventional phase change materials described below, well below the minimum photolithographic feature size used to create mask 74 (discussed below), typically about 200 nm.

Figure 6:
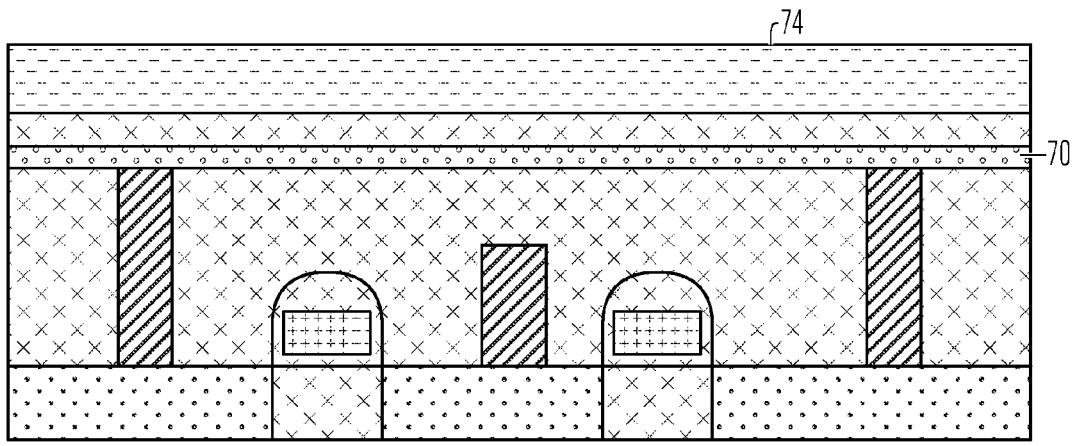
Figure 7:
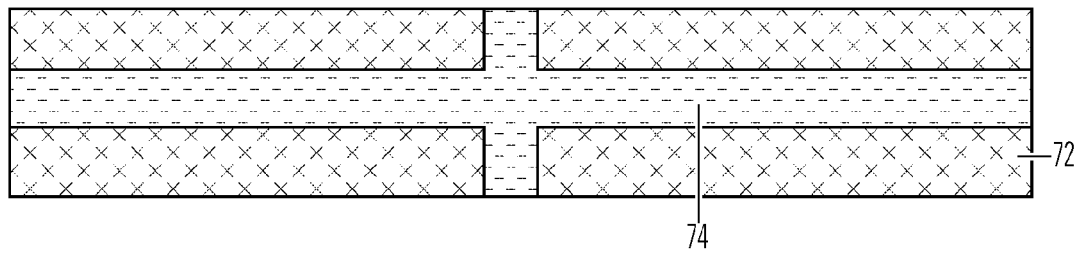
Figure 8:
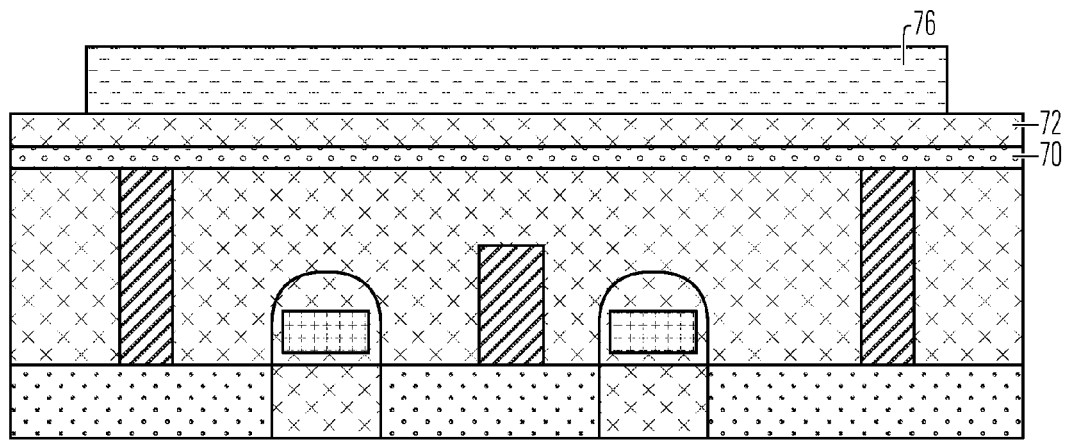
Figure 9:
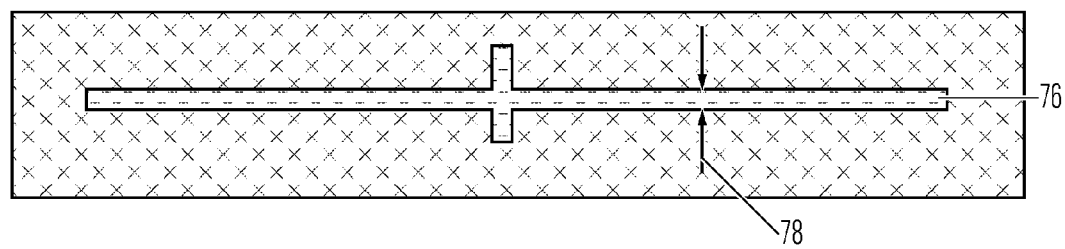

FIGS. 6 and 7 illustrate the result of forming a first photoresist mask 74 on first barrier layer 72. Mask 74 is typically made by lithography, typically photolithography, and is the first mask that will be used in creating phase change elements 52, 54. FIGS. 8 and 9 illustrate the result of a photoresist oxygen plasma trimming step to create a reduced size mask 76 having a first dimension 78, the first dimension corresponding to width 60 of FIG. 1. First dimension 78 is, in this embodiment, about 40 nm, well below the minimum photolithographic feature size used to create mask 74, typically about 200 nm. First dimension 78 is preferably about 10 to 50 nm and more preferably no more than about 40 nm thick.

Figure 10:
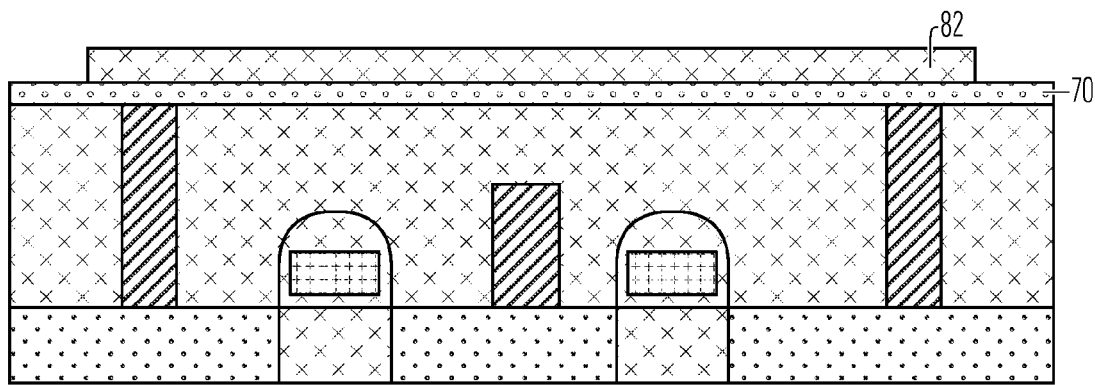
Figure 11:
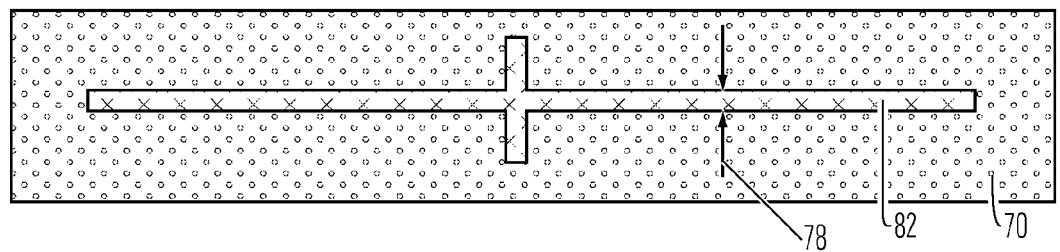
Figure 12:
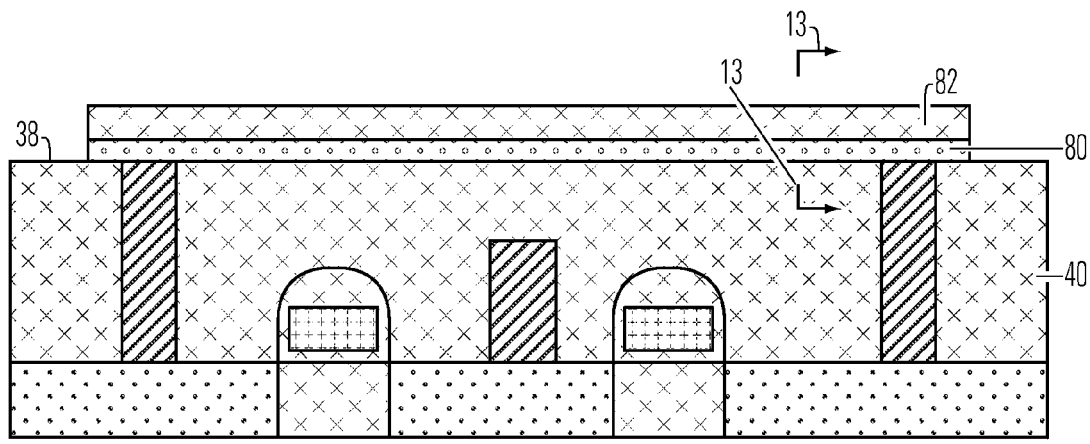

FIGS. 10 and 11 illustrate the result of etching layer 72 except where covered by reduced size mask 76 followed by the removal of mask 76. FIG. 12 shows a result of etching phase change material layer 70. These steps and optional sidewall itching step to reduce the sidewall dimension result in a first phase change element structure 80 and a first barrier layer structure 82 having the same shape as reduced size mask 76 illustrated in FIG. 11.

Figure 13:
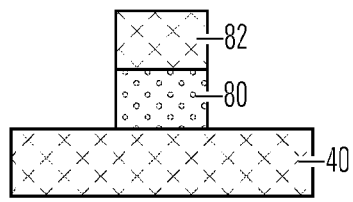
Figure 13A:
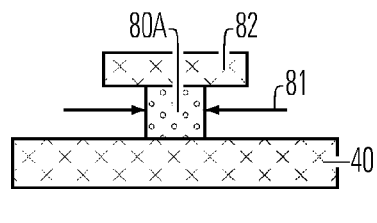
FIG. 13A is a cross-sectional view similar to that of FIG. 13 of alternative embodiment after sidewall etching of the phase change element.
Figure 13B:
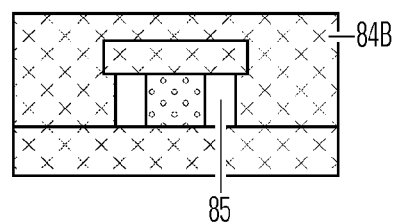
FIG. 13B shows the structure of FIG. 13A after deposition of a barrier layer forming voids adjacent to the phase change element.

FIG. 13 is a simplified cross-sectional view taken along line 13-13 of FIG. 12. FIG. 13A shows the structure of FIG. 13 after an optional step of sidewall etching of first phase change element structure 80 to create a sidewall etched structure 80A having a lateral dimension 81 that is less than the lateral dimension of structure 82, the lateral dimension of structure 82 typically being about 40 nm. FIG. 13B shows the structure of FIG. 13A after the deposition of a barrier layer 84B to create voids 85. Voids 85 enhance the thermal isolation of phase change element structure 80A thus helping to reduce the transition current required thus improving performance.

Figure 14:
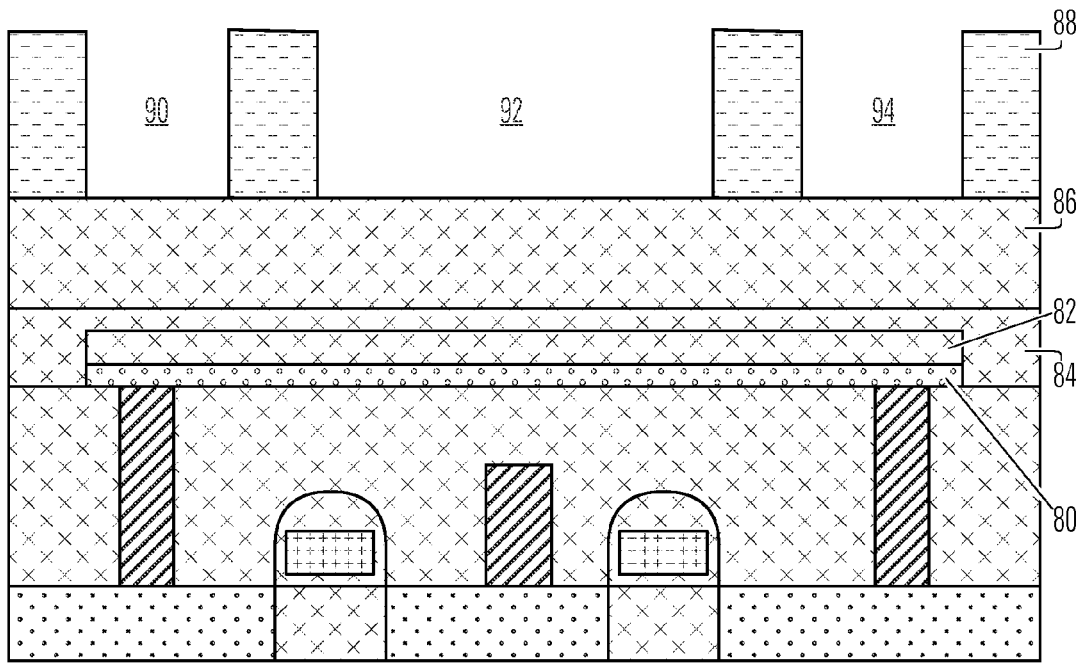
Figure 15:
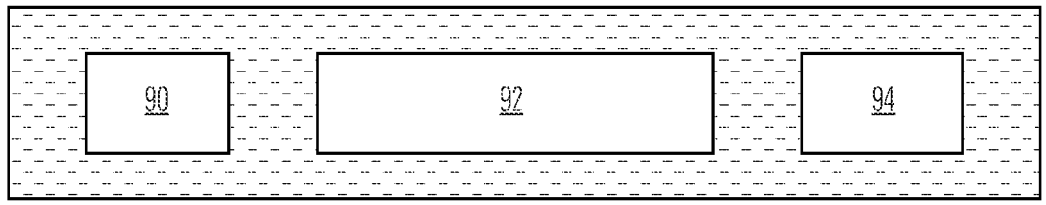

FIGS. 14 and 15 illustrate the result of several processing steps. A second barrier layer 84, typically made of SiN, is deposited on structures 82, 80 as well as exposed portions of top surface 38. A first separation layer 86, typically made of an oxide such as silicon oxide, is deposited on second barrier layer 84, layer 86 being about 300 nm thick in this embodiment. A second photoresist mask 88, typically made by photolithography, is formed on first separation layer 86. Mask 88 has first, second and third open regions 90, 92, 94 extending down to first separation layer 86.

Figure 16:
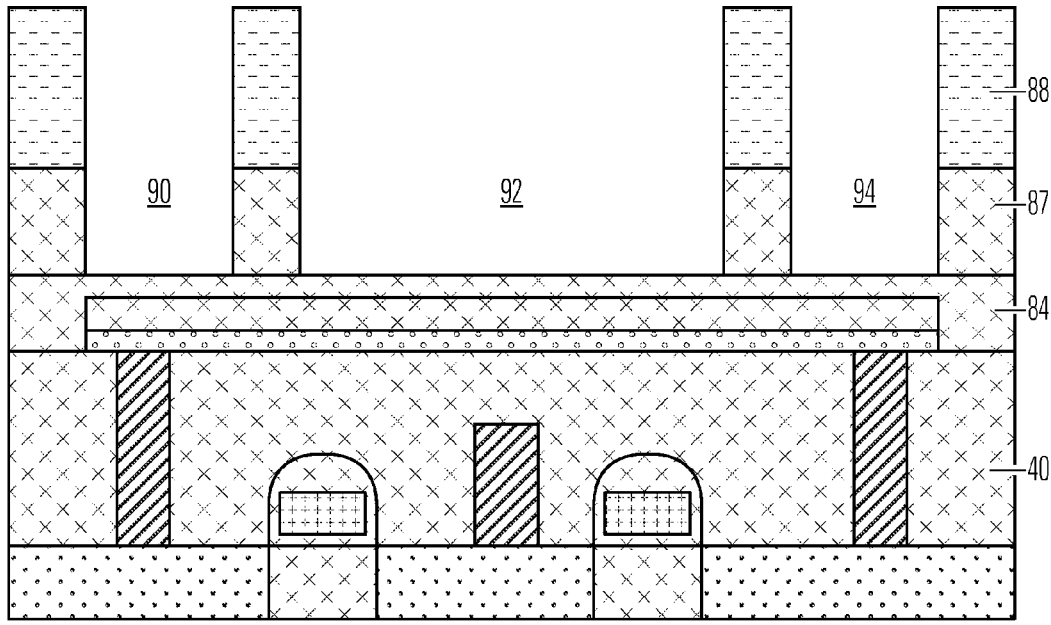
Figure 17:
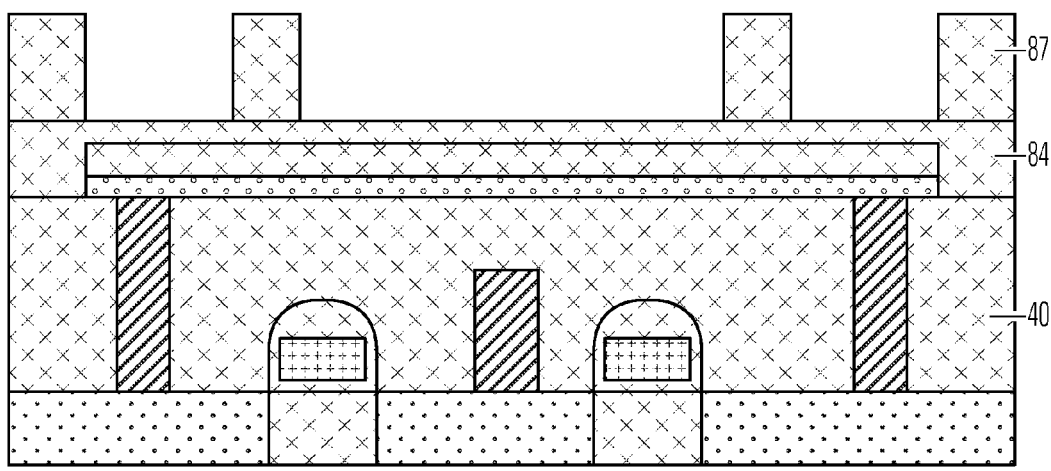

FIG. 16 illustrates the results of an oxide etching step in which portions of first separation layer 86 has been removed to extend open regions 90, 92 and 94 down to second barrier layer 84 leading etched first separation layer 87. FIG. 17 shows result of removing mask 88.

Figure 18:
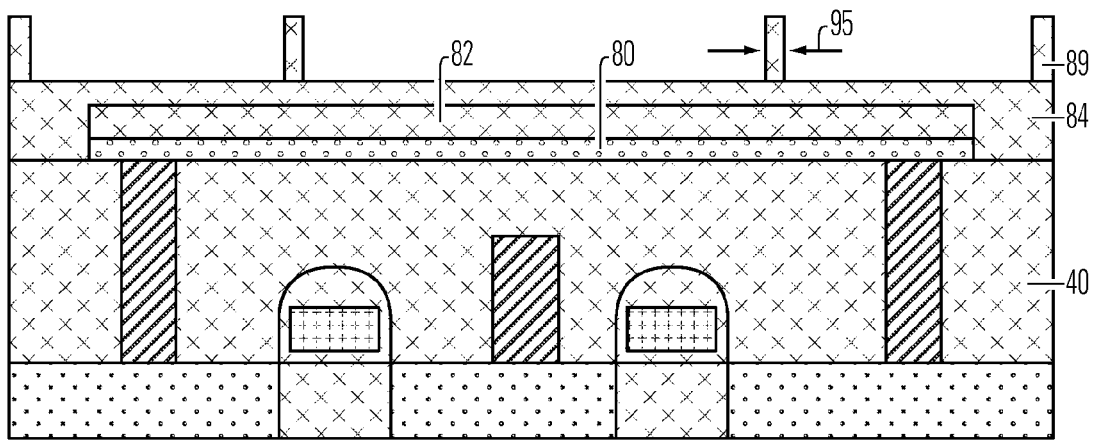
Figure 19:
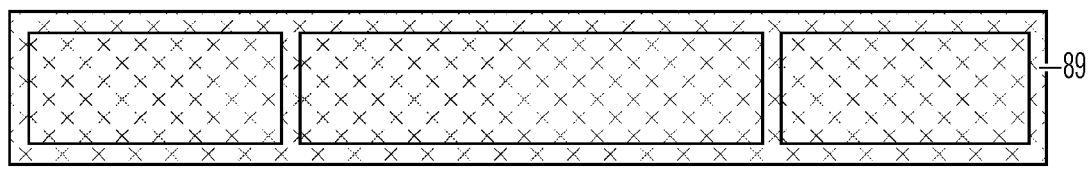

FIGS. 18 and 19 show the structure of FIG. 17 after an appropriate sidewall trimming step to reduce the sidewall dimension of etched first separation layer 87. Doing so creates a thinned and etched first separation layer, identified by reference numerals 89 and 95, having a reduced thickness substantially less than the minimum lithographic feature size, preferably about 20 to 150 nm, and more preferably about 60 nm. Such procedures may include a HF dip or a photoresist trimming procedure. The reduced thickness corresponds to length 56 of phase change elements 52, 54.

Figure 20:
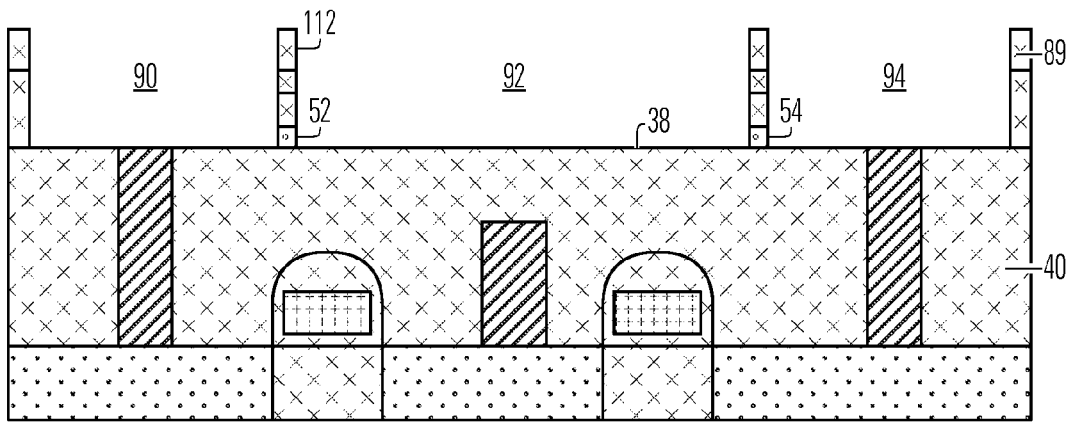

FIG. 20 shows result of etching second barrier layer 84, first barrier layer structure 82 and first phase change element structure 80 using appropriate etching techniques for the compositions of the various layers. In this case thinned and etched first separation layer 89 acts as a mask for the etching of layers 84, 82 and 80. This results in the creation of first and second phase change elements 52, 54.

Figure 21:
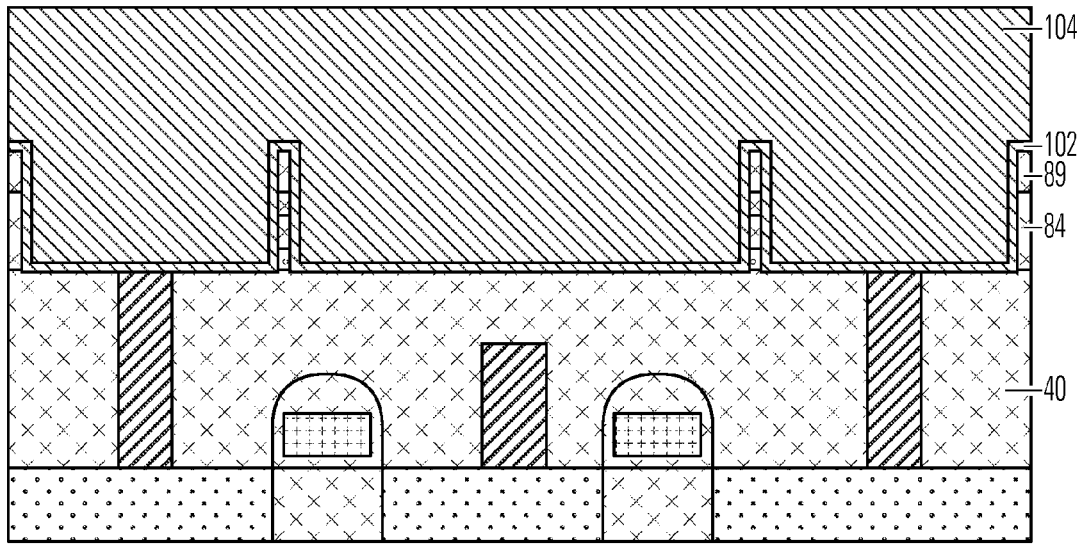
Figure 22:
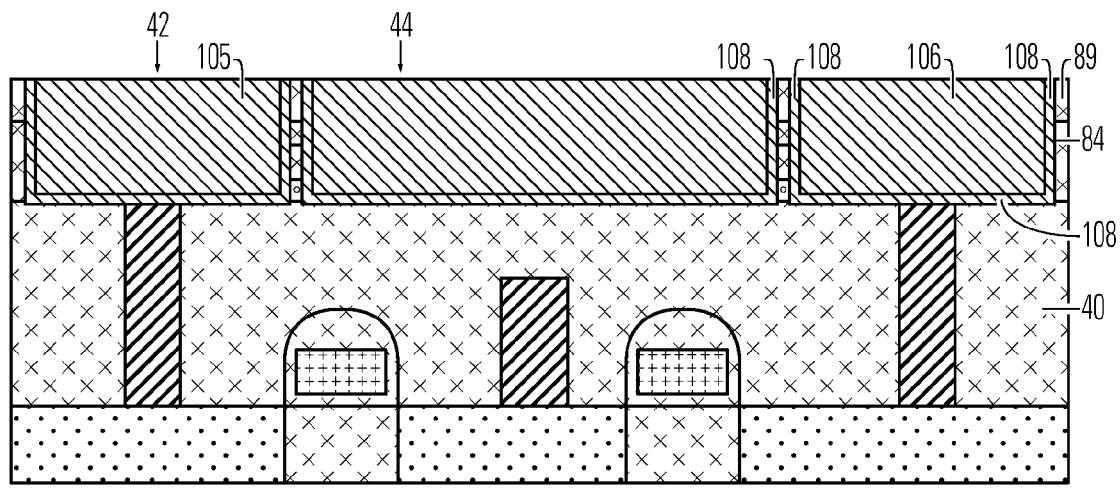
Figure 22A:
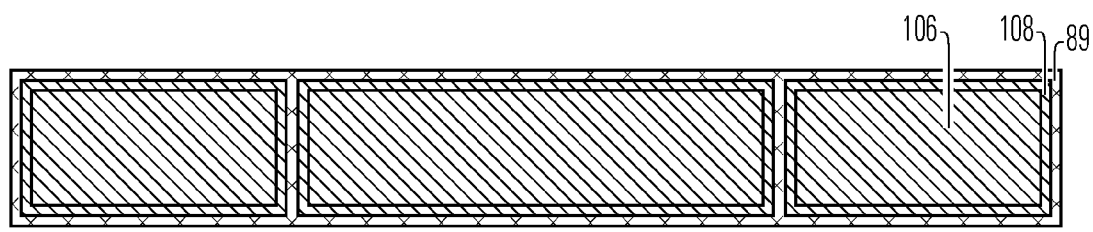

FIG. 21 illustrates the structure of FIG. 20 after the deposition of an electrical contact enhancement layer 102, typically TiN, followed by deposition of an electrical conductor 104, typically tungsten. Layer 102 is used to enhance the electrical contact between electrodes 42, 44, 46 and phase change elements 52, 54. A chemical mechanical polishing step is then used to create the structure shown in FIGS. 22 and 22A, including surface 105 and electrodes 42, 44, 46. Each electrode 42, 44, 46 includes a metal conductor element 106 from electrical conductor 104 and an electrical contact enhancement element 108 from electric contact enhancement layer 102.

Figure 22B:
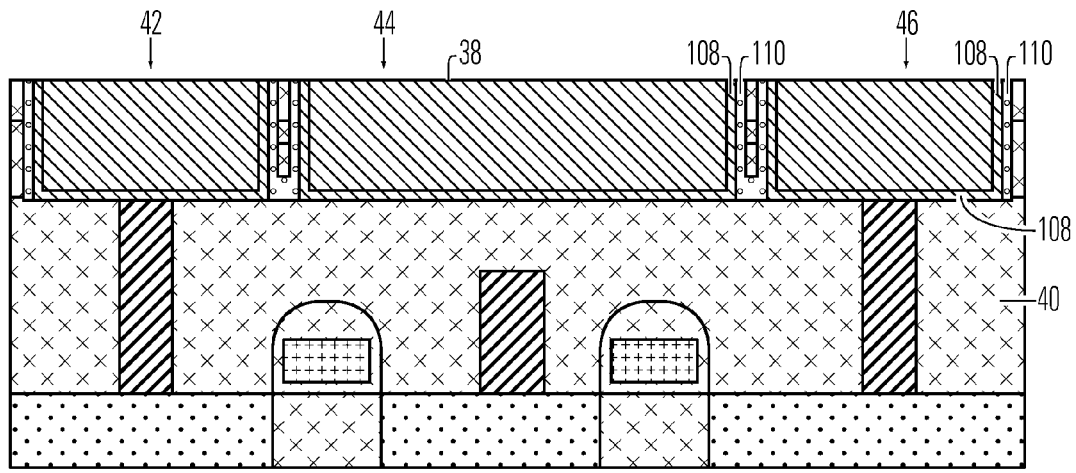
FIGS. 22B and 22C show alternative embodiments of the structure of FIG. 22 in which a layer of phase change material is used to help thermally isolate the phase change elements from the electrodes.
Figure 22C:
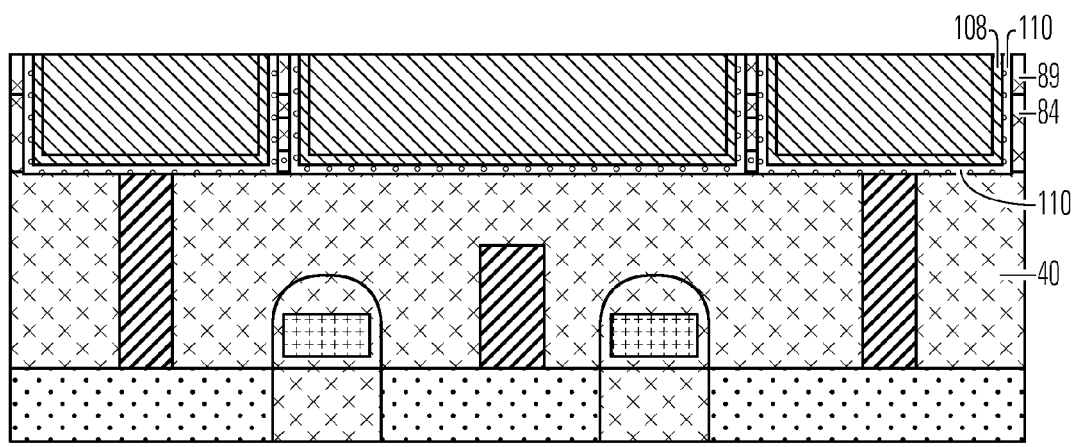

FIG. 22B shows an alternative environment in which a layer 110 of a phase change material is deposited on the sidewall 112 of the etched structure from element 89 to surface 38, see FIG. 20. Thereafter electrical contact enhancement layer 102 and electrical conductor 104 are deposited within open regions 90, 92 and 94 as discussed above with regard to FIGS. 21 and 22. The embodiment of FIG. 22C is similar to the embodiment of FIG. 22B but layer 110 also covers surface 38. In both embodiments layer 110 helps to improve the thermal isolation of phase change elements 52, 54 from the electrodes. This helps to decrease the current required to transition elements 52, 54 thus improving performance.

Figure 23:
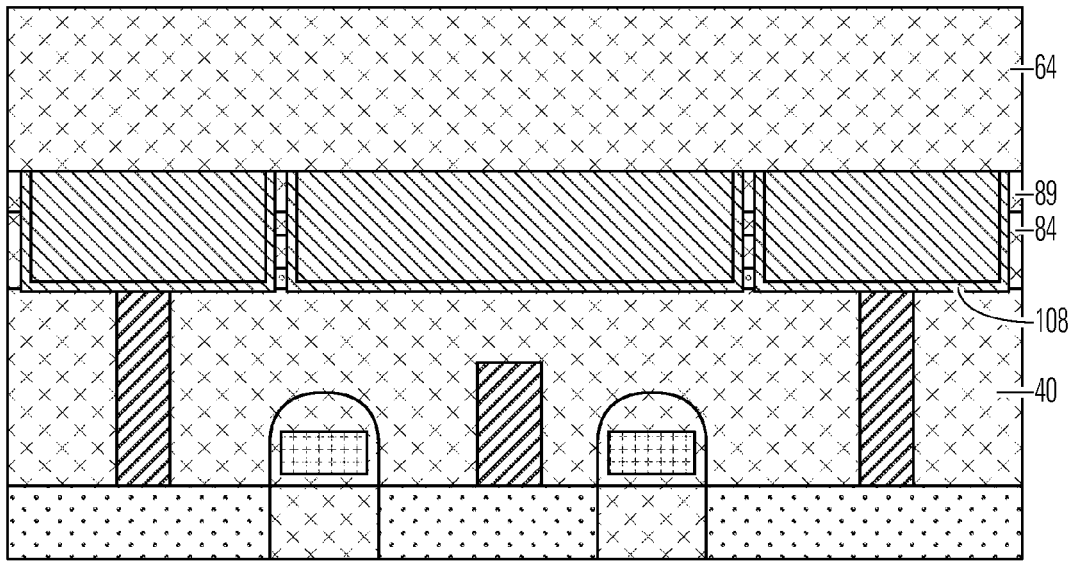
Figure 24:
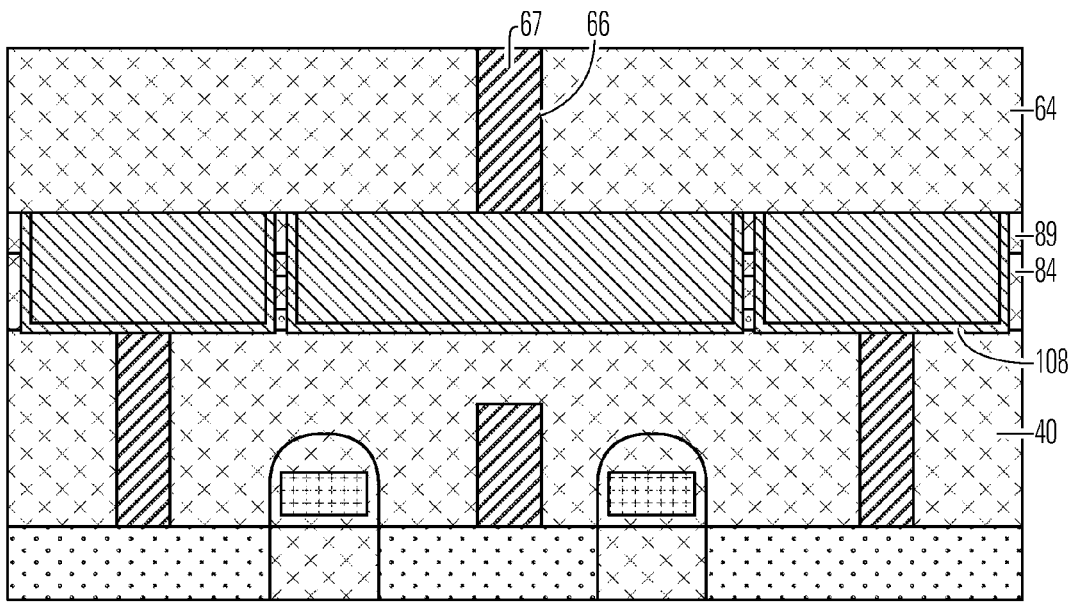
Figure 25:
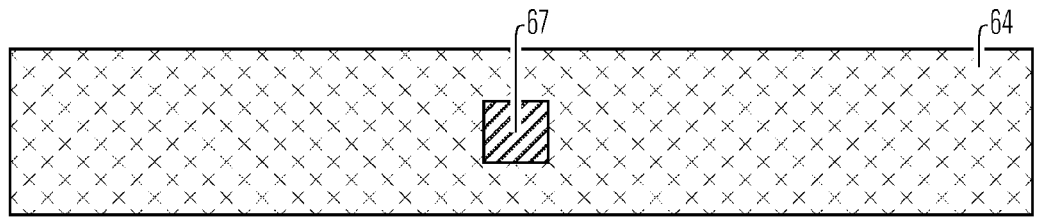

As shown in FIG. 23, second separation layer 64 is applied to surface 105 and via 66 is formed through layer 64 to contact second electrode 44. A second electrically conductive material is then applied onto layer 64 to create bit line 62 over layer 64. The resulting phase change memory device 10 is illustrated in FIGS. 1 and 2.

Plugs 35, 36, 67 are typically made of tungsten while common source line 34 and bit line 62 are typically created by copper metallization; other types of metallization, including aluminum, titanium nitride, and tungsten based materials, can be used as well.

Figure 26:
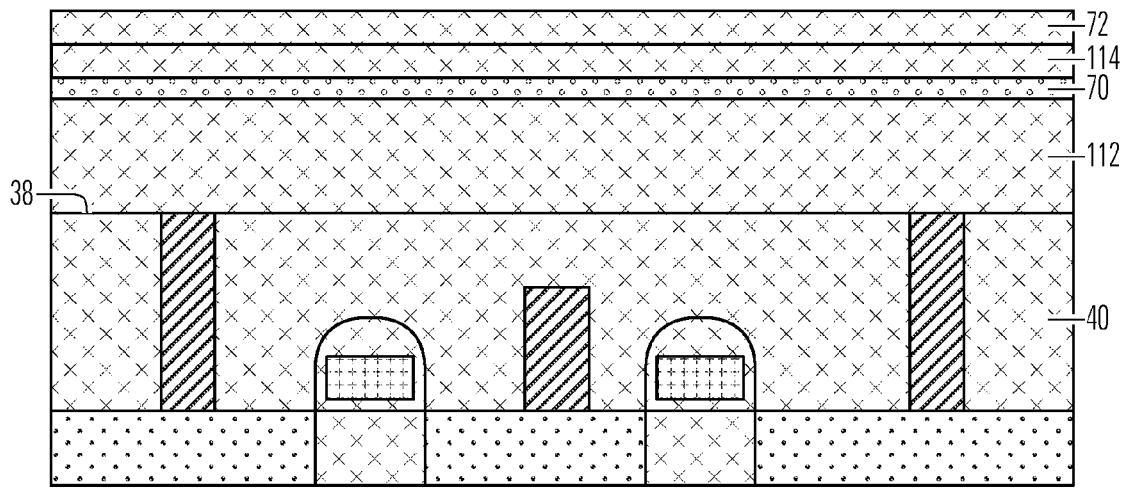
FIGS. 26-38 illustrates the steps used in making an alternative embodiment of the invention with FIG. 26 showing structure similar to that of FIG. 5 but including separation layers above and below the phase change material layer.
Figure 27:
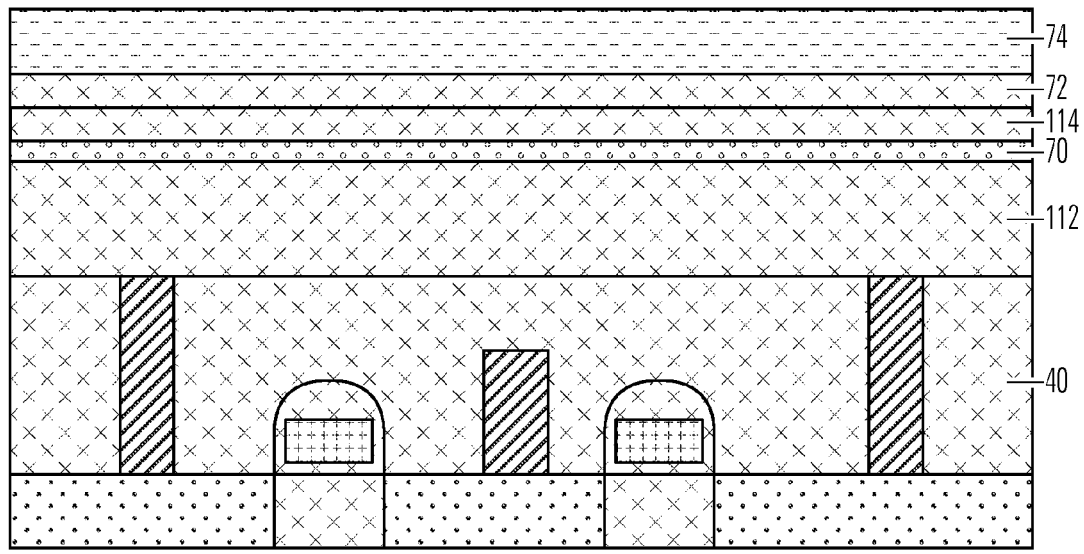
Figure 28:
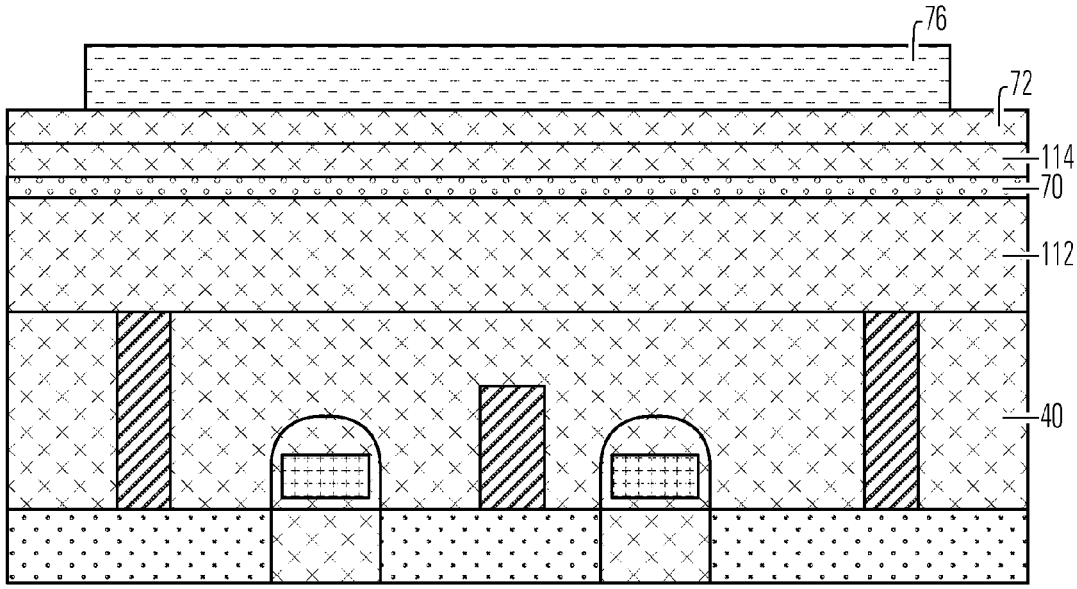
Figure 29:
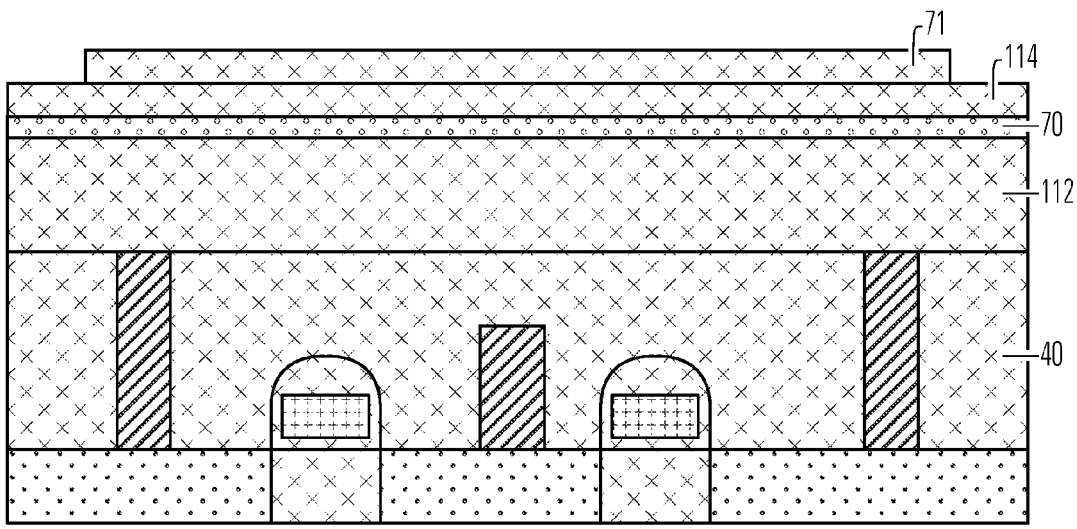
Figure 30:
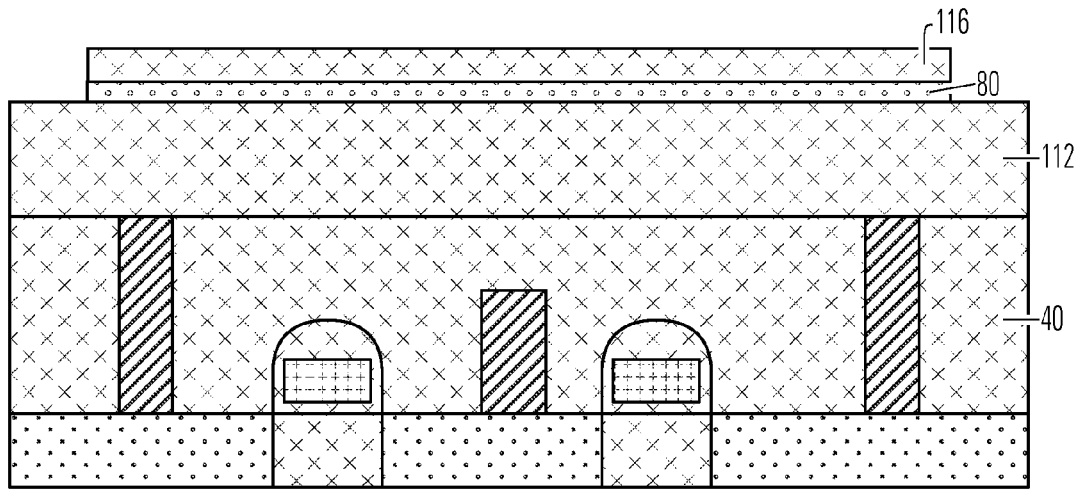

A further alternative embodiment will be discussed with reference to FIGS. 26-38. The initial manufacturing steps for this embodiment are the same as those disclosed in FIGS. 1-4. FIG. 26 illustrates a structure similar to that of FIG. 5 but also includes an underlying separation layer 112, between surface 38 and phase change material layer 70, and an overlying separation layer 114, between layer 70 and layer 72. Both of separation layers 112 and 114 are typically silicon dioxide. Other materials, such as SiN may also be used for one or both of separation layers 112, 114. FIG. 27 is similar to FIG. 6 and includes mask 74 deposited on layer 72. The top view of FIG. 27 is the same as FIG. 7. FIG. 28, similar to FIG. 8, illustrates trimming of mask 74 to obtain reduced size mask 76 with the top view the same as FIG. 9. FIG. 29, similar to FIG. 10, shows the result of etching of barrier layer 72 to create an etched why I need a barrier layer 71 and the removal of mask 76. The top view of FIG. 29 is the same as in FIG. 11. FIG. 30 is similar to FIG. 12 and shows the result of etching separation layer 114 and phase change material layer 70 and then the removal of etched barrier layer 71. Doing so results in etched overlying separation layer 116 and first phase change element structure 80.

Figure 31:
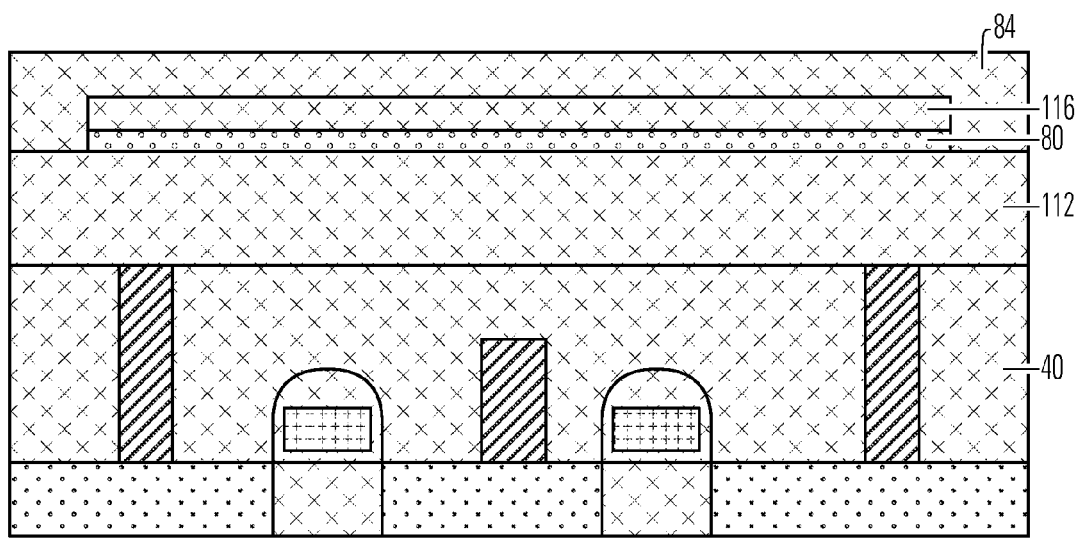
Figure 32:
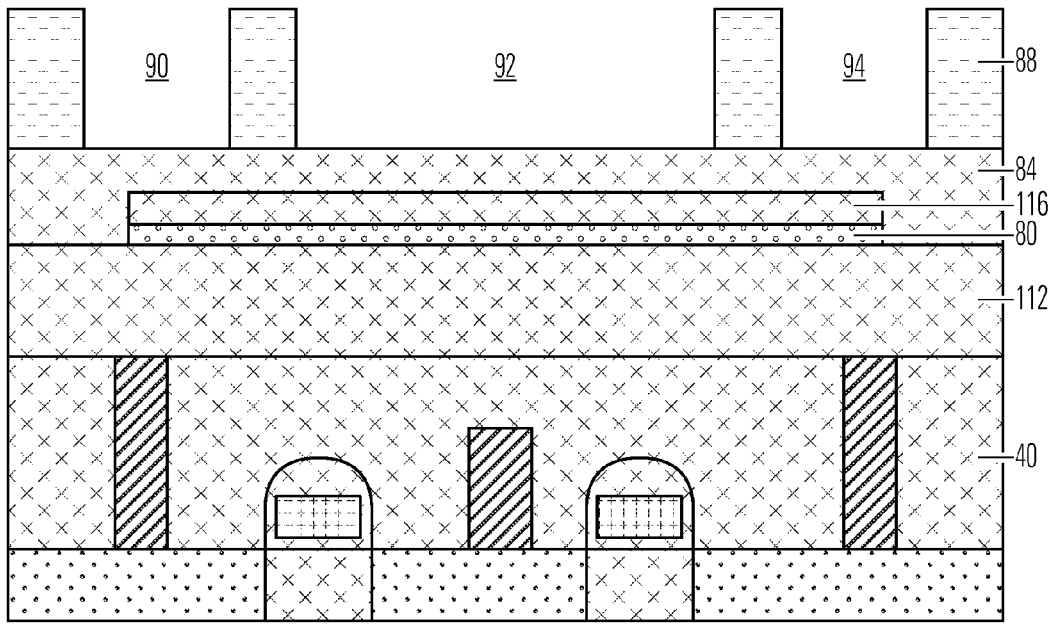
Figure 33:
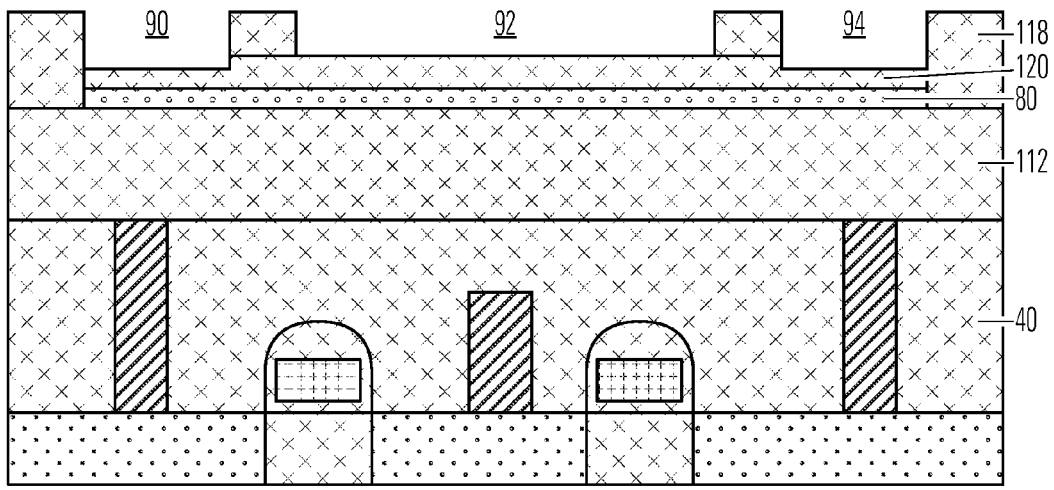
Figure 34:
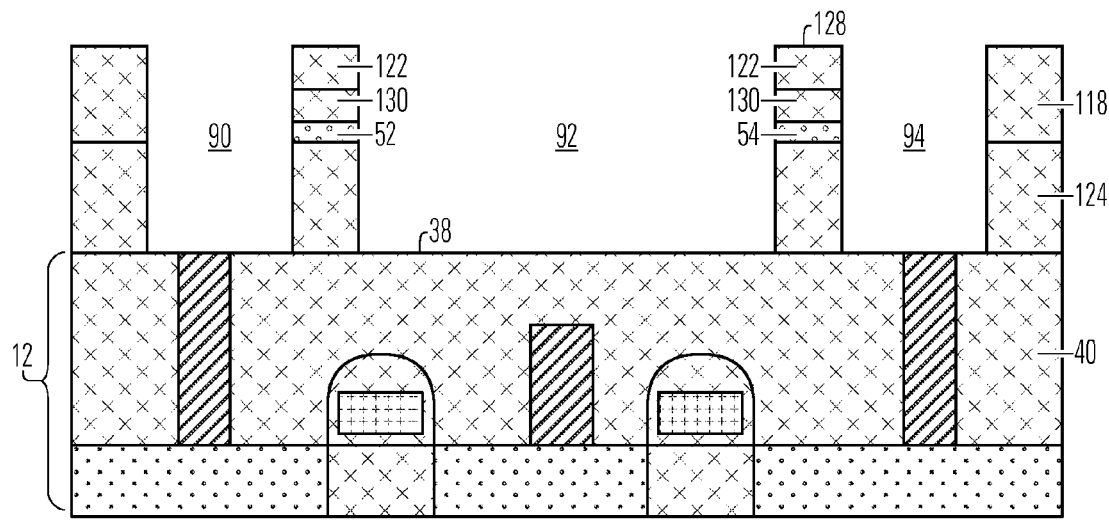

FIG. 31 shows the deposition of second barrier layer 84, typically SiN, over layer 116, structure 80 and layer 112. Thereafter, as shown in FIG. 32, mask 88, typically of SiN, is formed on layer 84 with open regions 90, 92 and 94 formed therein. The top view is the same as FIG. 15. As shown in FIG. 33, portions of layer 84 and layer 116 below open regions 90, 92 and 94 are etched and then mask 88 is removed leaving an etched barrier layer 118 and a further etched overlying separation layer 120. FIG. 34 shows the results of stack etching of material below open regions 90, 92 and 94, through underlying separation layer 112 and down to surface 38 of layer 40. This creates an etched underlying separation layer 124 with phase change elements 52, 54 spaced apart above surface 38 and thus spaced apart above memory cell access layer 12. The portions of barrier layer 118 above phase change elements 52, 54 act as a protective cap during the etching of underlying separation layer of 112.

Figure 35:
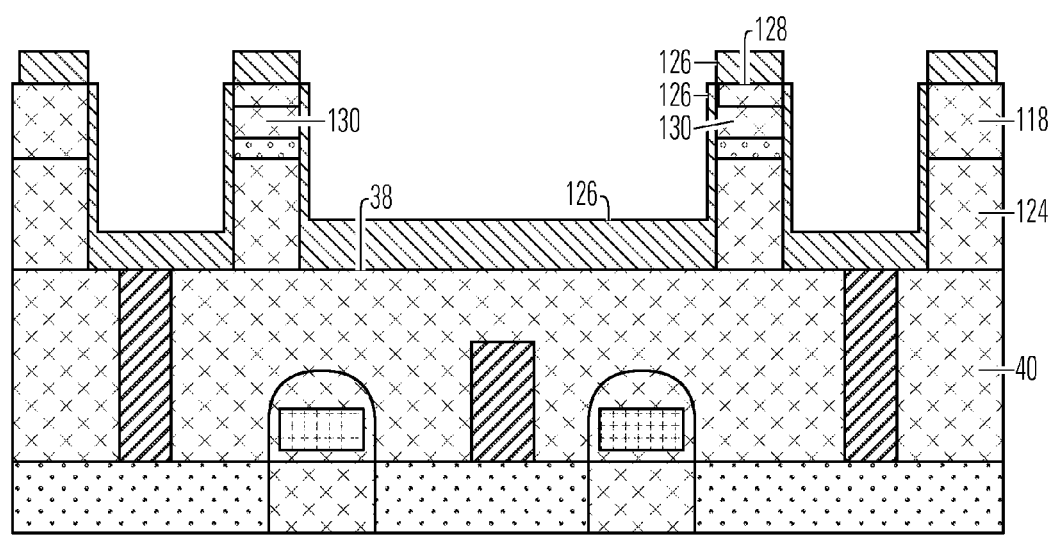
Figure 36:
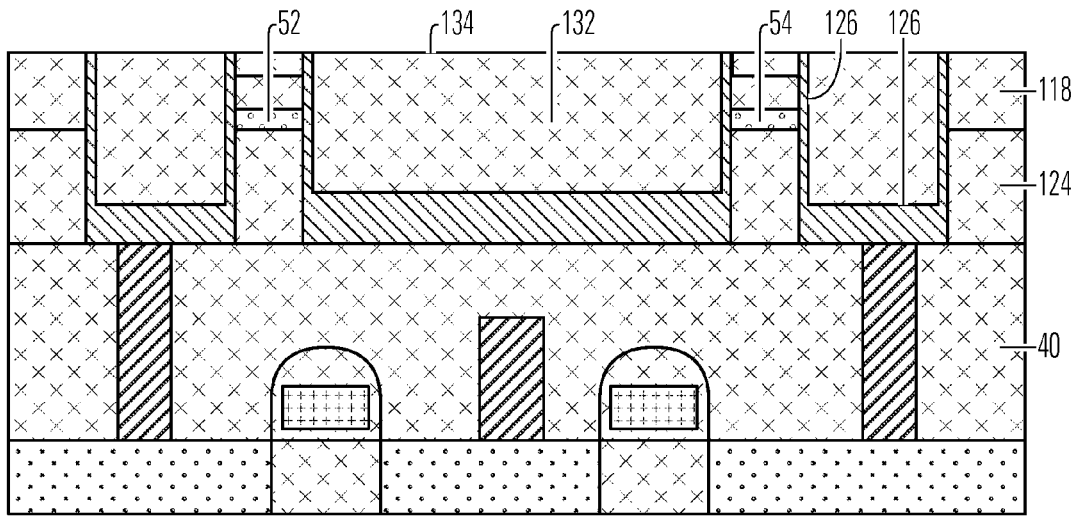
Figure 37:
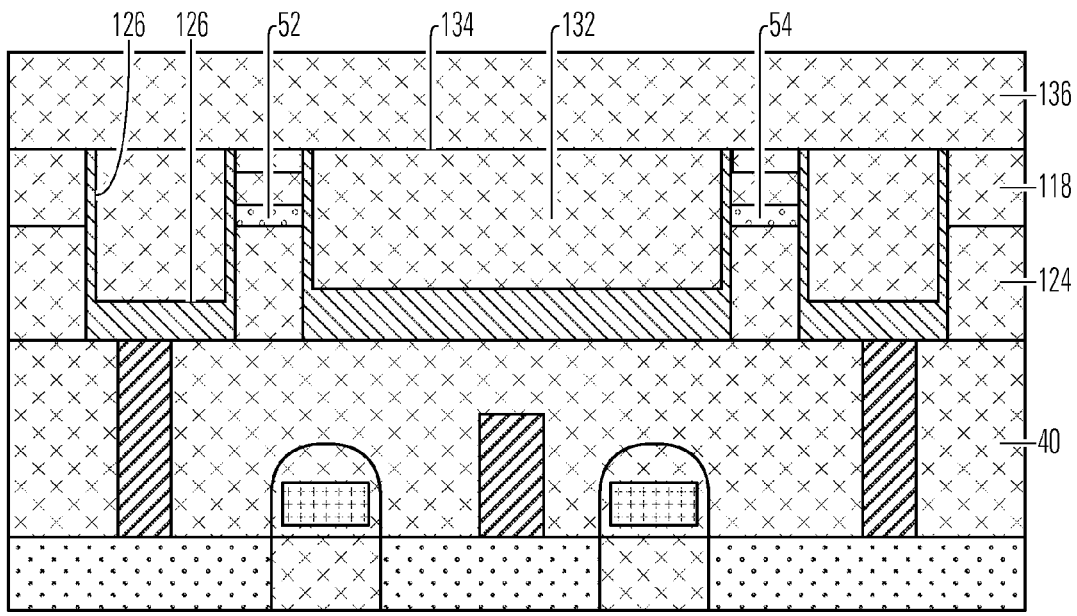
Figure 38:
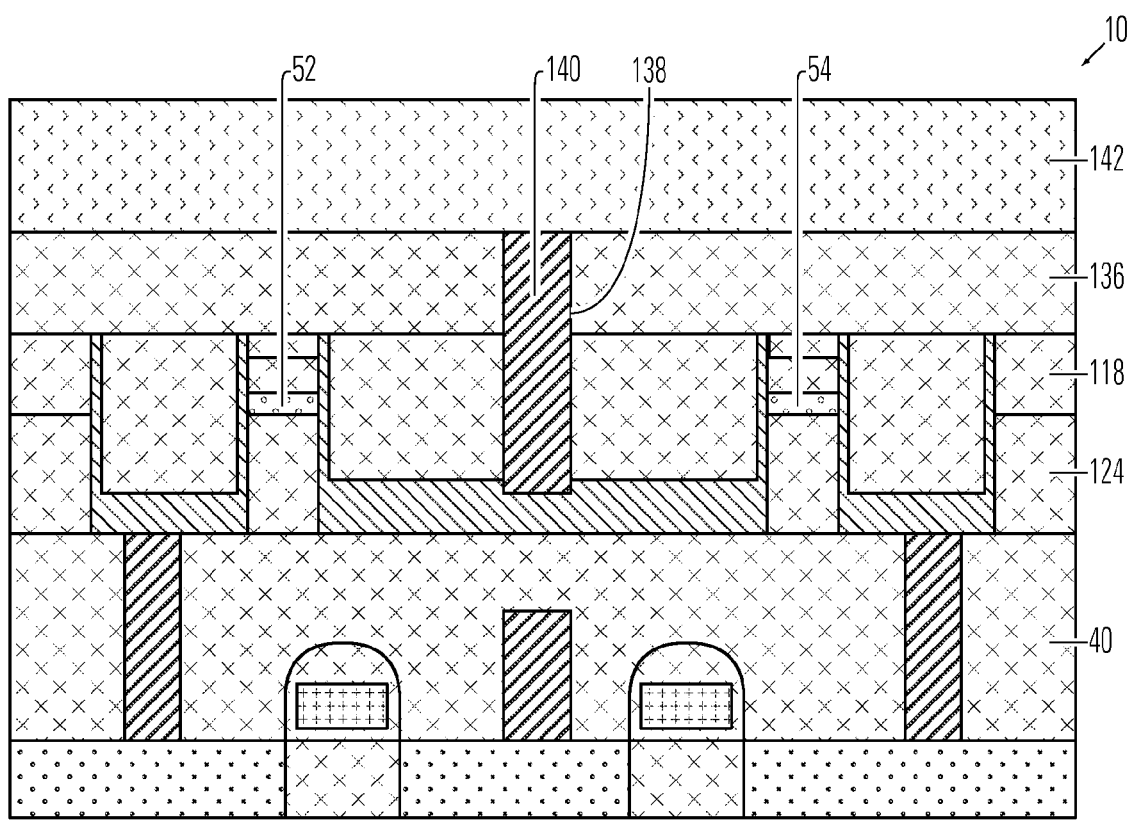

FIG. 35 illustrates the result of deposition of an electrical contact enhancement layer 126, typically TiN, on top surface 128, sidewalls 130 and surface 38 of the structure of FIG. 34. FIG. 36 illustrates results of deposition of an oxide 132, such as $SiO_2$, followed by chemical mechanical polishing to create surface 134. Thereafter an oxide or other separation layer 136 is deposited on surface 134, see FIG. 37. A via 138 is formed through oxide layer 136 and oxide 132 followed by metallization, typically creating a tungsten plug 140 within via 138 and a metal layer 142. Metal layer 142 covers oxide layer 136 and contacts plug 140. The resulting phase change memory device 10 is shown in FIG. 38.

Embodiments of the memory cell include phase change based memory materials, including chalcogenide based materials and other materials, for phase change elements 52, 54. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IV of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$.

One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", *SPIE* v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. A material useful for implementation of a PCRAM described herein is Ge2Sb2Te5. Other types of phase change materials can also be used.

The invention has been described with reference to phase change materials. However, other memory materials, also sometimes referred to as programmable materials, can also be used. As used in this application, memory materials are those materials having electrical properties, such as resistance, that can be changed by the application of energy; the change can be a stepwise change or a continuous change or a combination thereof. Other programmable resistive memory materials may be used in other embodiments of the invention, including N2 doped GST, GexSby, or other material that uses different crystal phase changes to determine resistance; PrxCayMnO3, PrSrMnO, ZrOx, or other material that uses an electrical pulse to change the resistance state; TCNQ, PCBM, TCNQ-PCBM, Cu-TCNQ, Ag-TCNQ, C60-TCNQ, TCNQ doped with other metal, or any other polymer material that has bistable or multi-stable resistance state controlled by an electrical pulse. Further examples of programmable resistive memory materials include GeSbTe, GeSb, NiO, Nb—SrTiO3, Ag—GeTe, PrCaMnO, ZnO, Nb2O5, Cr—SrTiO3.

For additional information on the manufacture, component materials, use and operation of phase change random access memory devices, see U.S. patent application Ser. No. 11/155,067, filed 17 Jun. 2005, entitled Thin Film Fuse Phase Change Ram And Manufacturing Method.

Advantages of an embodiment described herein include better electrical contact between the electrodes and the phase change elements. In addition, the use of a thermal insulation material between the electrodes and the phase change element enhances the thermal insulation between the electrodes and the phase change element. The provision that the length, width and thickness of the phase change element ensures that the volume of the phase change element is less than the cube of the minimum lithographic feature size used to form the phase change memory cell. Therefore, the current used in reset and programming is confined in a small volume allowing high current density and resultant local heating at lower reset current levels and lower reset power levels.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are hereby incorporated by reference.

What is claimed is:

1. A method for making a phase change memory device comprising:
    forming a memory cell access layer on a substrate, the memory cell access layer comprising an access device and a top surface;
    forming a memory cell layer, operably coupled to the memory cell access layer, comprising a lithographically formed phase change memory cell, said memory cell comprising:
        first and second electrodes having first and second opposed, spaced apart contact elements, respectively;
        a phase change element positioned between the first and second contact elements and electrically coupling the first and second contact elements to one another; and
        the phase change element having a width, a length and a thickness, the length measured between the first and second contact elements and the width measured perpendicular to the length, both the width and the length measured parallel to the top surface; and
    the memory layer forming step being carried out so that:
        the volume of the phase change element is less than the cube of the minimum lithographic feature size used to form the phase change memory cell;
        at least one of the length and the width of the phase change element is less than said minimum lithographic feature size; and
        the area of contact between the phase change element and the first contact element, defined by the width and thickness of the phase change element, is less than the square of said minimum lithographic feature size.

2. The method according to claim 1, wherein the memory layer forming step comprises conducting a wet etching process to at least partially define at least one of the width and the length.

3. The method according to claim 1, wherein the memory layer forming step comprises covering at least a portion of the contact elements with a thermal isolation material.

4. The method according to claim 3, wherein the contact elements covering step is carried out using a phase change material.

5. The method according to claim 1, wherein the memory layer forming step comprises forming an electrical contact enhancement material between the first and second contact elements and the phase change element to enhance the electrical contact with the phase change element.

6. The method according to claim 5, wherein the memory layer forming step comprises covering at least a portion of the electrical contact material with a thermal isolation material.

7. The method according to claim 6, further comprising using the same material as the phase change element for the electrical contact material.

8. A method for making a phase change memory device comprising:
    forming a memory cell access layer on a substrate, the memory cell access layer comprising an access device and a top surface;
    depositing a phase change material layer on the top surface;
    depositing a first barrier layer on the phase change material layer;
    forming a first mask on the first barrier layer;
    reducing the size of the first mask to create a first reduced size mask having a first dimension, the first dimension being less than a minimum lithographic feature size of the first mask forming step;
    etching the portions of the first barrier layer not masked by the reduced size mask to expose the top surface and create a first barrier layer structure;
    removing the reduced size mask;
    etching portions of the phase change material layer not covered by the first barrier layer structure to create a first phase change element structure;
    depositing a second barrier layer over the first phase barrier layer structure and the top surface;
    depositing a first separation layer on the second barrier layer;
    forming a second mask on the first separation layer;
    etching portions of the first separation layer not covered by the second mask;

removing the second mask;

reducing the size of the first separation layer to create a reduced size first separation layer having a second dimension, the second dimension being less than a minimum lithographic feature size of the second mask forming step;

etching all material down to the top surface that is not covered by the reduced size first separation layer to create first and second material stacks extending from the top surface, the first and second material stacks comprising first and second phase change elements spaced apart from one another;

covering the material stacks and the top surface with an electrical contact enhancement material;

applying an electrical conductor on the electrical contact enhancement layer to create electrodes in contact with the phase change elements through the electrical contact enhancement material;

applying a second separation layer over the electrodes and the material stacks;

forming a via through the second separation layer to open onto a chosen one of the electrodes; and applying a second electrically conductive material on the second separation layer and within the via.

9. The method according to claim 8, further comprising depositing a layer of phase change material onto the first and second material stacks prior to the electrical contact enhancement material covering step.

10. The method according to claim 8, further comprising depositing a layer of phase change material onto the first and second material stacks and the top surface prior to the electrical contact enhancement material covering step.

11. A method for making a phase change memory device comprising:

forming a memory cell access layer on a substrate, the memory cell access layer comprising an access device and a top surface;

depositing an underlying separation layer on top surface;

depositing a phase change material layer on the underlying separation layer;

depositing an overlying separation layer on the phase change material layer;

depositing a first barrier layer on the overlying separation layer;

forming a first mask on the first barrier layer;

reducing the size of the first mask to create a first reduced size mask having a first dimension, the first dimension being less than a minimum lithographic feature size of the first mask forming step;

etching the portions of the first barrier layer not masked by the reduced size mask to create a first barrier layer structure;

removing the reduced size mask;

etching portions of the overlying separation layer and the phase change material layer not covered by the first barrier layer structure to create an etched overlying separation layer and a first phase change element structure;

removing the first barrier layer structure;

depositing a second barrier layer over the etched overlying separation layer and the first phase barrier layer structure and the top surface;

forming a second mask on the second barrier layer;

etching portions of the second barrier layer not covered by the second mask to create an etched barrier layer;

removing the second mask;

etching all material down to the top surface that is not covered by the etched second barrier layer to create first and second material stacks extending from the top surface, the first and second material stacks comprising first and second phase change elements spaced apart from one another and spaced apart from the top surface;

covering the material stacks and the top surface with an electrical contact enhancement material so that the electrical contact enhancement material is in contact with the phase change elements;

applying a second separation layer over the electrical contact enhancement material and the material stacks;

forming a via through the second separation layer to open the electrical contact enhancement material; and applying an electrically conductive material on the second separation layer and within the via.

12. The method according to claim 11, wherein the second separation layer applying step comprises depositing a first amount of a separation material, and then performing a surface-smoothing procedure on the first amount of the separation material, and then depositing a second amount of a separation material.

* * * * *